US007903399B2

(12) United States Patent
Kim et al.

(10) Patent No.: US 7,903,399 B2
(45) Date of Patent: Mar. 8, 2011

(54) FLAT PANEL DISPLAY DEVICE

(75) Inventors: Min-Cheol Kim, Suwon-si (KR); Gil-Jae Choi, Suwon-si (KR); Sang-Hyun Lee, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 0 days.

(21) Appl. No.: 12/320,885

(22) Filed: Feb. 6, 2009

(65) Prior Publication Data

US 2009/0201635 A1 Aug. 13, 2009

(30) Foreign Application Priority Data

Feb. 11, 2008 (KR) ........................ 10-2008-0012341

(51) Int. Cl.

| | |
|---|---|
| ***H05K 5/00*** | (2006.01) |
| *H02B 1/00* | (2006.01) |
| *H05K 7/20* | (2006.01) |
| *G02F 1/13333* | (2006.01) |
| *A47B 81/00* | (2006.01) |
| *H01K 1/58* | (2006.01) |

(52) U.S. Cl. .................... 361/679.21; 361/685; 361/667; 361/671; 349/58; 349/60; 312/223.1; 313/33.46

(58) Field of Classification Search ........... 361/679.01–679.61; 349/58, 60–64; 313/33.46; 312/223.1; 362/26, 31, 559, 362/561

See application file for complete search history.

(56) References Cited

U.S. PATENT DOCUMENTS

| | | | | |
|---|---|---|---|---|
| 5,436,745 | A * | 7/1995 | Voisin et al. | 349/58 |
| 6,392,723 | B1 * | 5/2002 | Sugiyama et al. | 349/58 |
| 7,140,732 | B2 * | 11/2006 | Shiraishi et al. | 353/33 |
| 2005/0094053 | A1 * | 5/2005 | Byun | 349/58 |
| 2005/0270728 | A1 * | 12/2005 | Chen et al. | 361/681 |
| 2006/0087601 | A1 * | 4/2006 | Lee | 349/60 |
| 2007/0211416 | A1 * | 9/2007 | Zhang et al. | 361/681 |
| 2008/0094794 | A1 * | 4/2008 | Hass | 361/685 |

FOREIGN PATENT DOCUMENTS

| | | |
|---|---|---|
| KR | 10-1996-066371 | 10/1998 |
| KR | 20-1999-004481 | 2/1999 |
| KR | 1020050026736 A | 3/2005 |
| KR | 10-2005-0070555 | 7/2005 |

(Continued)

OTHER PUBLICATIONS

Korean Office issued on Dec. 30, 2009, corresponding to Korean Patent Application No. 10-2008-0012341.

(Continued)

*Primary Examiner* — Jayprakash N Gandhi
*Assistant Examiner* — Jerry Wu
(74) *Attorney, Agent, or Firm* — Robert E. Bushnell, Esq.

(57) ABSTRACT

A flat panel display device includes a bezel and a flat display panel accommodated in the bezel. The bezel includes a substrate part, bent parts, each of which is formed on one of edges of the substrate part and extends substantially perpendicular to the substrate part, and a protrusion formed at an end of one of the bent parts. In another embodiment, a flat panel display device further includes a cover bezel covering the bezel and the flat display panel. The cover bezel has an open window through which light from the flat panel display transmits, and the cover bezel includes an insertion part that is coupled with the protrusion.

20 Claims, 4 Drawing Sheets

40 I I' 42 41 12 20 12a 13 11 10

40 41 30 20 12 12a 13 42 B 11 21 10 22 23 24 25 27

FOREIGN PATENT DOCUMENTS

| | | | |
|---|---|---|---|
| KR | 1020060014322 | A | 2/2006 |
| KR | 10-2006-0101689 | | 9/2006 |
| KR | 10-2006-0124410 | | 12/2006 |
| KR | 10-2007-0001545 | | 1/2007 |
| KR | 10-0759675 | | 9/2007 |
| KR | 10-2007-0102069 | | 10/2007 |

OTHER PUBLICATIONS

Transmitter letter and Korean Office Action issued on Jun. 25, 2009 in the corresponding Korean Patent Application No. 10-2008-0012341.

* cited by examiner

FLAT PANEL DISPLAY DEVICE

CLAIM OF PRIORITY

This application makes reference to, incorporates the same herein, and claims all benefits accruing under 35 U.S.C. §119 from an application for FLAT PANEL DISPLAY DEVICE earlier filed in the Korean Intellectual Property Office on the 11 Feb. 2008 and there duly assigned Serial No. 10-2008-0012341.

BACKGROUND OF THE INVENTION

1. Field of the Invention

The present invention relates to a flat panel display device, and more particularly, to a flat panel display device including a bezel having a bent part, and a cover bezel coupled with the bezel.

2. Description of the Related Art

Generally, flat panel display (FPD) devices such as a liquid crystal display (LCD) device, a field emission display (FED) device, and an organic light emitting diode (OLED) display device are accommodated in a bezel functioning as a frame to mechanically and electrically protect the FPDs.

However, a conventional bezel has a rectangular shape, which is vulnerable to external shock, especially at sides thereof. Further, when the bezel is equipped in an electronic appliance, a separate adhesive tape or a complicated device is needed to prevent movement of the bezel.

A flat display panel display accommodated in the bezel may further include a cover bezel having a light emitting opening to further protect an upper portion thereof, the cover bezel covering the bezel and the flat panel display device. To connect the cover bezel with the flat display panel and the bezel, an additional process of attaching a separate tape is needed. Here, an attachment area is limited to secure an emitting region of the flat display panel, so that bonding strength can be relatively lowered.

Moreover, the tape is difficult to be completely removed when it has to be re-attached due to occurrence of defects.

SUMMARY OF THE INVENTION

The present invention provides a flat panel display device including a bezel having at least one protrusion at an end of a bent part, and a cover bezel having an insertion part coupled with the protrusion.

In an exemplary embodiment of the present invention, a flat panel display device includes a bezel and a flat display panel accommodated in the bezel. The bezel includes a substrate part, bent parts, each of which is formed on one of edges of the substrate part and extends substantially perpendicular to the substrate part, and a protrusion formed at an end of one of the bent parts. The flat panel display panel includes a plurality of pixels to display an image.

In another exemplary embodiment of the present invention, a flat panel display device includes a bezel, a flat display panel accommodated in the bezel, and a cover bezel covering the bezel and the flat display panel. The bezel includes a substrate part, bent parts, each of which is formed on one of edges of the substrate part and extends substantially perpendicular to the substrate part, and a protrusion formed at an end of one of the bent parts. The flat panel display panel includes a plurality of pixels to display an image. The cover bezel has an open window through which light from the flat panel display transmits, and the cover bezel includes an insertion part that is coupled with the protrusion.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein: The above and other objects, features and advantages of the present invention will be described in reference to specific exemplary embodiments thereof with reference to the attached drawings in which.

DETAILED DESCRIPTION OF THE INVENTION

Figure 1:
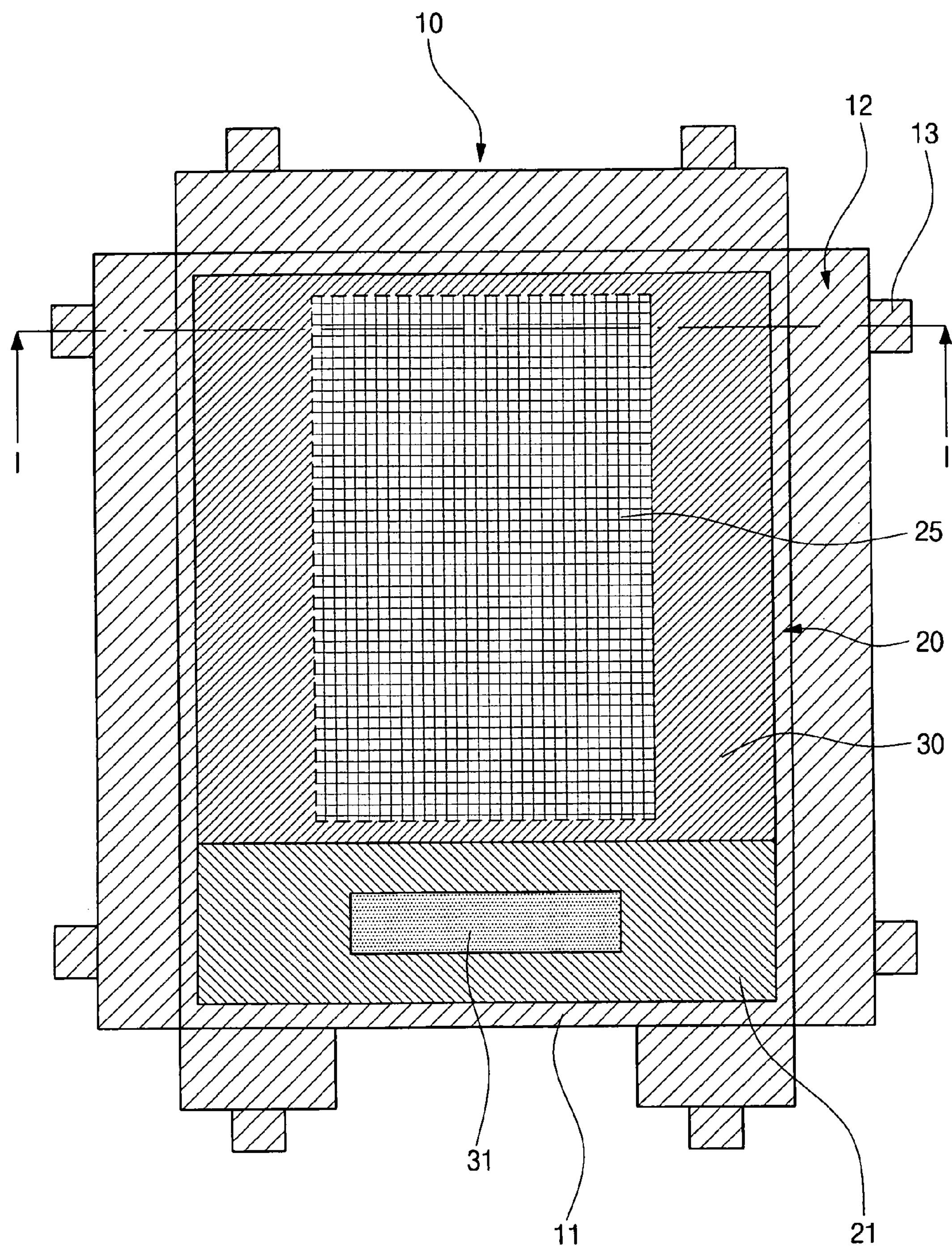
FIG. 1 is a plan view of an organic light emitting diode display device according to a first exemplary embodiment of the present invention.

The present invention will now be described more fully hereinafter with reference to the accompanying drawings, in which exemplary embodiments of the invention are shown. In the drawings, lengths and thicknesses of layers and regions may be exaggerated for clarity. Further, like numerals denote the like elements throughout the specification.

First Exemplary Embodiment

Figure 2:
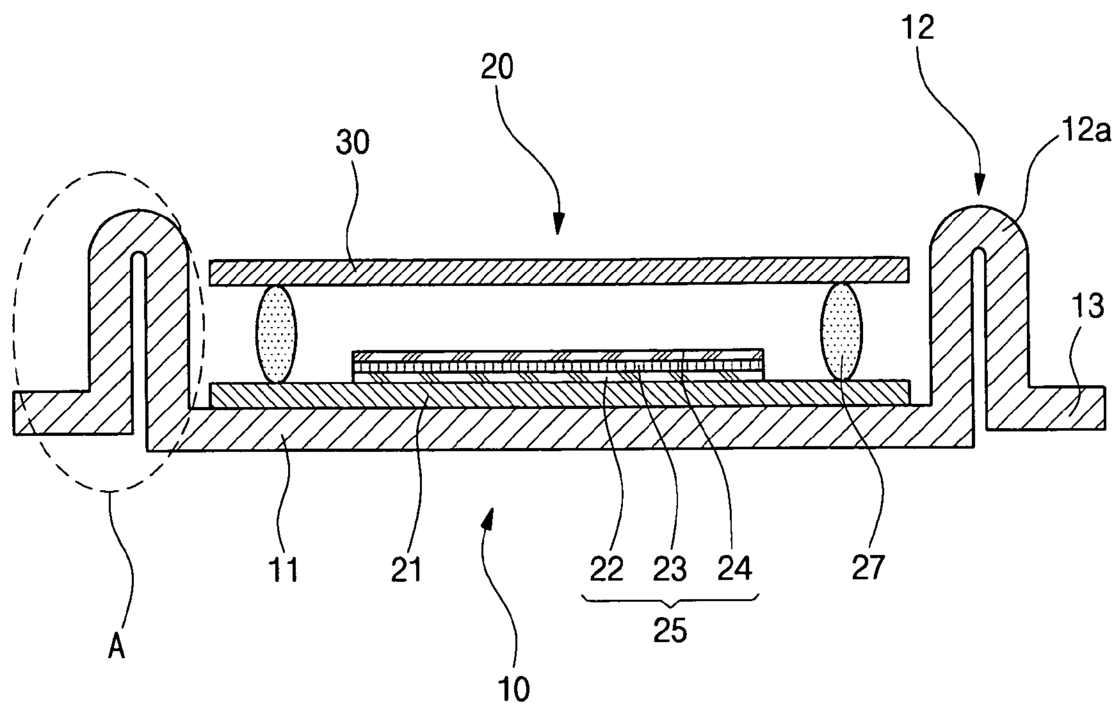
FIG. 2 is a cross-sectional view taken along line I-I' of FIG. 1.

FIG. 1 is a plan view of an organic light emitting diode (OLED) display device according to a first exemplary embodiment of the present invention, and FIG. 2 is a cross-sectional view taken along line I-I' of FIG. 1.

Referring to FIGS. 1 and 2, an OLED display device includes a bezel 10, an organic light emitting panel 20, and a flexible printed circuit board (FPCB, not illustrated).

The bezel 10 includes a substrate part 11 supporting the organic light emitting panel 20, bent parts 12 formed on edges of the substrate part 11 and bent from the substrate part 11, and protrusions 13 each formed at an end of the bent part 12. All of the bent parts 12 are bent in the same direction. The substrate part 11, the bent parts 12 and the protrusions 13 may be formed of the same material.

The substrate part 11 serves as a base supporting and holding the organic light emitting panel 20. Here, the substrate part 11 is generally formed of a conductive metallic material, and connected with the organic light emitting panel 20 and a ground terminal of the FPCB, such that electrical reliability can be improved.

The bent parts 12 are formed on the edges of the substrate part 11, and all of the bent parts 12 are bent in the same direction. For example, the bent parts can be bent upwards in the first exemplary embodiment of the present invention as shown in FIG. 2.

The organic light emitting panel 20 is accommodated inside the bezel 10, which has substrate part 11 and the bent parts 12, so that the organic light emitting panel 20 can be protected from external shock.

Here, the bent part 12 may further have a hemming structure 12*a*, which is formed by folding the layer of the bent part 12, as illustrated in FIG. 2. The hemming structure 12*a* increases mechanical strength of the OLED display device. In the first exemplary embodiment of the present invention, an outside hemming structure 12*a* is formed, in which the bent part 12 is outwardly folded from the bezel 10.

Figure 3:
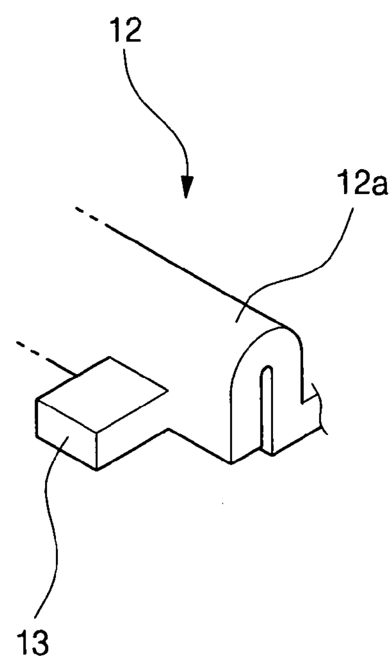
FIG. 3 is an enlarged view of region A of FIG. 2.

The protrusion 13 is formed at the end of the bent part 12, and formed perpendicular to the bent part 12. That is, other portions of the end of the bent part 12, except a specific portion to be the protrusion 13, may be removed by press-cutting. Subsequently, the specific region is bent in perpendicular to the bent part 12, so as to form the protrusion 13. At least one protrusion 13 may be formed at the end of the bent part 12, and mechanically inserted into a structure (not illustrated) of an electronic apparatus such as an organic light emitting diode (OLED) display device, such that coupling strength can be improved. More particularly, referring to FIG. 3, which is an enlarged view of region A of FIG. 2, the protrusion 13 may be inserted into the structure of the electronic apparatus or may serve as a mechanical hook with respect to the structure, such that bonding strength of the OLED display device can be improved.

Further, the protrusion 13 has a shock-absorbing function to protect the bent part 12 from direct shock and disperse shock when physical shock is applied to sides of the bezel 10. Thus, the bent part 12 is curved inside the bezel 10, such that damage to the sides of the organic light emitting panel 20 can be prevented. As a result, the protrusion 13 can improve durability of the OLED display device, and bonding strength when the OLED display device is equipped in an electronic apparatus.

The organic light emitting panel 20 includes a device substrate 21 on which a pixel region 25 having a plurality of pixels is formed, an encapsulation substrate 30 coupled to the device substrate 21, and a pad part 31 providing an electrical signal to drive the pixel.

The device substrate 21 may be formed of an insulating material such as glass or plastic. On the device substrate 21, a pixel is formed of an organic light emitting diode including a first electrode 22 having a reflective layer (not illustrated), an organic light emitting layer 23 formed on the first electrode 22, and a second electrode 24 formed on the organic light emitting layer 23.

While one organic light emitting diode is illustrated for convenience of the description in FIG. 2, a plurality of pixels is formed in the pixel region 25 in practice.

Here, a hole injection layer and a hole transport layer may be formed between the organic light emitting layer 23 and the first electrode 22, and an electron transport layer and an electron injection layer may be formed between the organic light emitting layer 23 and the second electrode 24. The encapsulation substrate 30 may be formed of the same material as the device substrate 21, and edges of the device substrate 21 are coupled to with the encapsulation substrate 30 by a sealant 27 to protect the pixel region 25 formed therein from external air. As the sealant 27, an UV hardening agent or a thermal hardening agent as epoxy may be used.

The organic light emitting diode may be an active-matrix organic light emitting diode, which further includes a thin film transistor having a semiconductor layer formed between the device substrate 21 and the first electrode 20, a gate electrode corresponding to the semiconductor layer and source and drain electrodes electrically connected with the semiconductor layer.

The organic light emitting panel 20 is attached and fixed onto the substrate part 11 of the bezel 10 by a cushion tape (not illustrated) having adhesive tapes on one and the other surfaces thereof. Here, the cushion tape may be formed of a PORON material.

Then, the FPCB (not illustrated) is connected with the pad part 31 of the organic light emitting panel 20, and the pad part 31 serves to provide an electrical signal to a data driver (not illustrated) and a scan driver (not illustrated) to drive the plurality of pixels formed in the pixel region 25 of the organic light emitting panel 20. The FPCB is formed at one side of the bent parts 12 formed at the edges of the substrate part 11 of the bezel 10, connects an external circuit with the organic light emitting panel 20 through between the bent parts 12 separated from each other, and generally may be formed at one side of a short side.

Second Exemplary Embodiment

Figure 4:
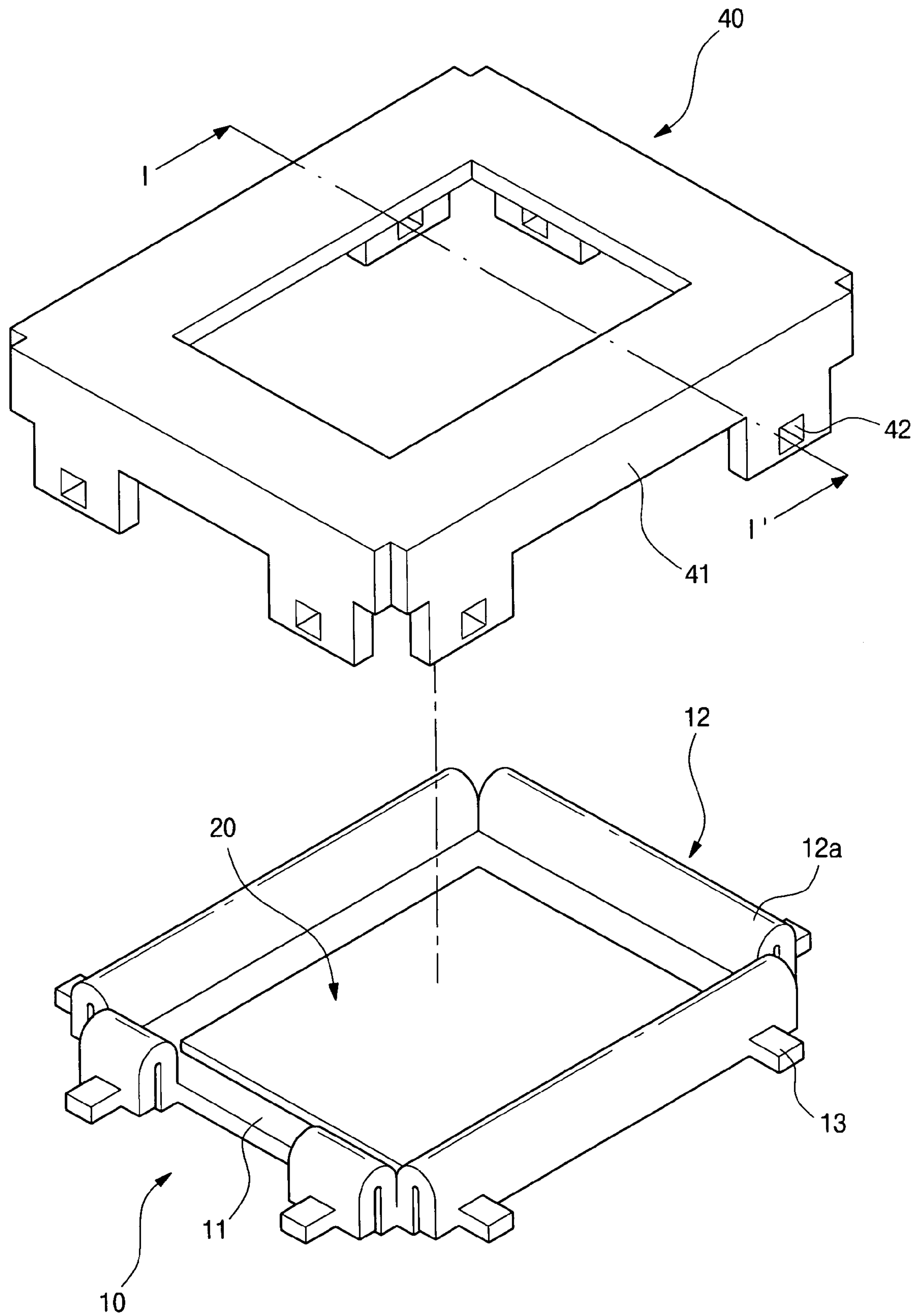
FIG. 4 is a diagram of an organic light emitting diode display device according to a second exemplary embodiment of the present invention.
Figure 5:
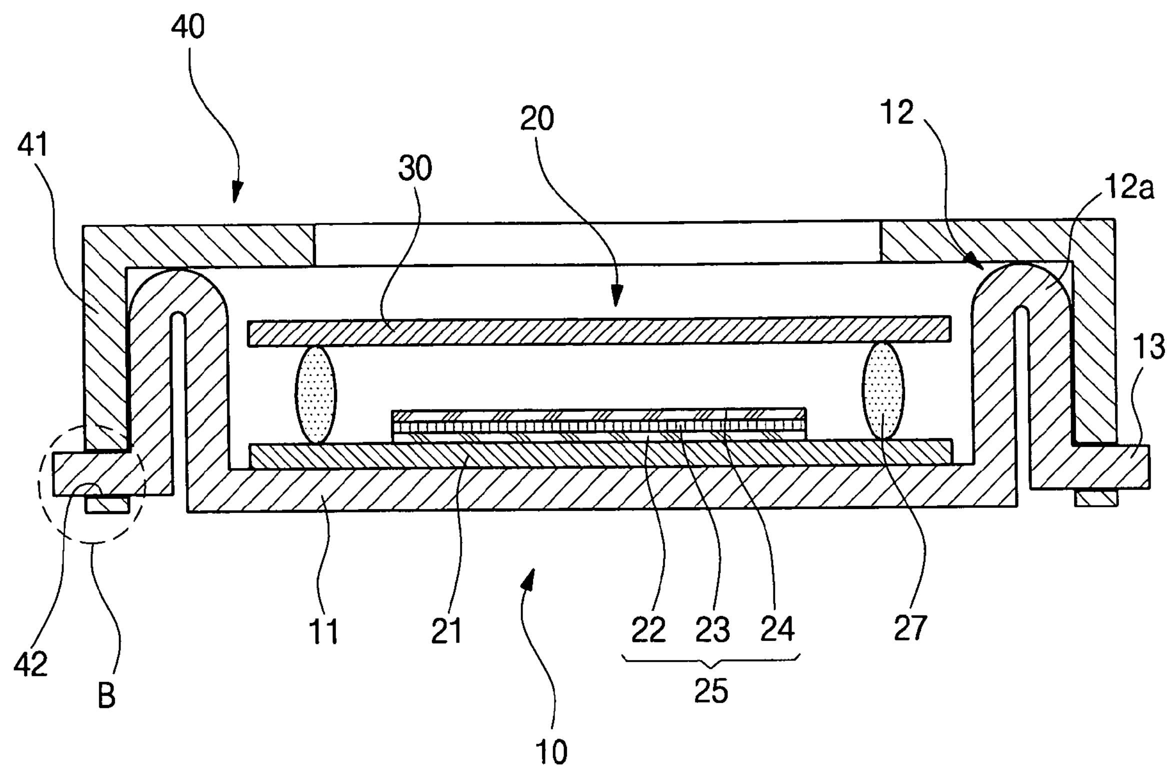
FIG. 5 is a cross-sectional view taken along line I-I' of FIG. 4.

FIG. 4 is a diagram of an OLED display device according to a second exemplary embodiment of the present invention, and FIG. 5 is a cross-sectional view taken along line I-I' of FIG. 4.

Referring to FIGS. 4 and 5, an OLED display device includes a bezel 10, an organic light emitting panel 20, a FPCB (not illustrated) and a cover bezel 40.

In the second exemplary embodiment of the present invention, the cover bezel 40 is further included in the OLED display device according to the first exemplary embodiment to protect the upper portion of the organic light emitting panel 20. Except the cover bezel 40, the bezel 10, the organic light emitting panel 20 and the FPCB (not illustrated) are the same as those in the first exemplary embodiment, and thus a description thereof will be omitted.

The cover bezel 40 has an open window or an opening in the center thereof to outwardly transmit light from the organic light emitting panel 20 accommodated in the bezel. Further, the cover bezel 40 has bent parts 41 formed by downwardly bending edge portions of the cover bezel 40.

An insertion part 42 having an opening may be formed to be coupled with the protrusion 13 of the bezel 10 in the bent part 41, such that the bezel 10 and the cover bezel 40 are fastened to each other. Here, the insertion part 42 further protrudes downwardly from the bent part 41, and therefore an empty space is formed between two of the insertion parts 42 as shown in FIG. 4. In this configuration, the insertion part 42 is more easily coupled with or separated from the protrusion 13 due to elasticity of the insertion part 42. The bent part 41 of the cover bezel 40 and the insertion part 42 may be formed of the same material without separate welding.

A cushion tape (not illustrated) having an adhesive tape on one surface thereof may be disposed between the cover bezel 40 and the organic light emitting panel 20. More particularly, the cushion tape having an adhesive tape may be attached onto one surface of an edge of the organic light emitting panel 20, and then the cover bezel 40 may be disposed to further protect the organic light emitting panel 20 from external shock.

Alternatively, the cushion tape having an adhesive tape may be attached onto one surface of an edge of the cover bezel 40, and then the cover bezel 40 may be disposed, which may have the same effect. Here, the cushion tape may be formed of a PORON material.

Thus, difficulty of separation during re-coupling process caused by attaching a conventional cushion tape having adhesive tapes on both one and the other surfaces thereof between the organic light emitting panel 20 and the cover bezel 40 may be solved. Further, it can have an advantage of saving elements since the adhesive tape is attached onto only one surface.

Figure 6A:
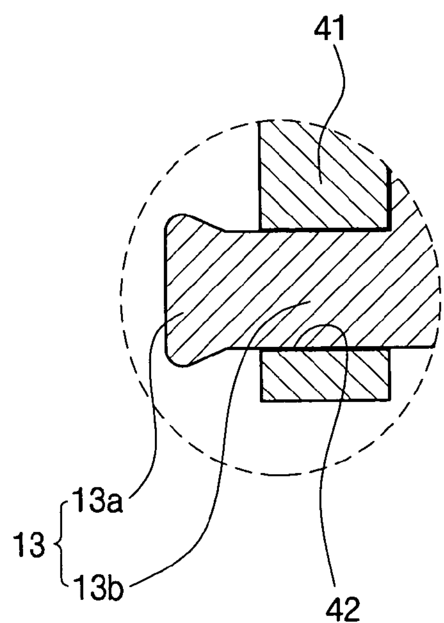
FIGS. 6A and 6B are cross-sectional views showing other exemplary embodiments of region B of FIG. 5.
Figure 6B:
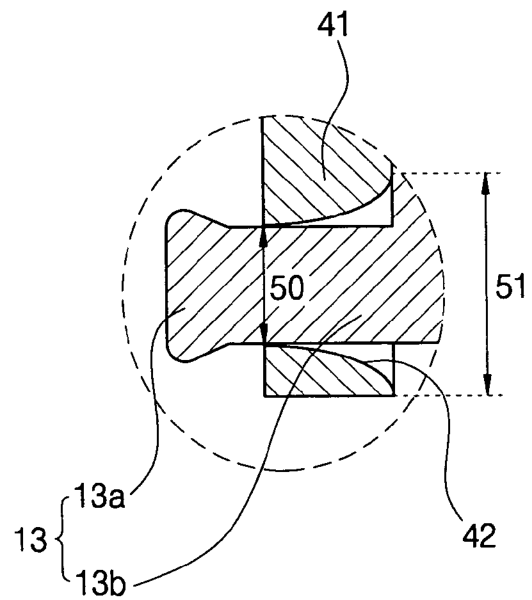

FIGS. 6A and 6B are cross-sectional views showing other exemplary embodiments of region B of FIG. 5.

Referring to FIG. 6A, the protrusion 13 includes a coupling part 13*a* fastened to the insertion part 42, and a body part 13*b* supporting the coupling part 13*a*. Here, the coupling part 13*a* may be formed larger or thicker than the body part 13*b*, such that bonding strength between the bezel 10 and the cover bezel 40 can be improved.

Referring to FIG. 6B, an outer size 50 of the opening of the insertion part 42 of the cover bezel 40 may be smaller than an inner size 51 of the opening thereof. The protrusion 13 is inserted through the inner and outer openings. Thus, the protrusion 13 may be easily inserted into the inner opening of the insertion part 42, and difficult to be separated from the insertion part 42 at external shock because of the smaller outer size 50 of the opening of the insertion part 42.

As a result, the present invention can be expected to increase bonding strength and easiness of handling, and thus to enhance reliability of products and reduce a production cost.

While the OLED display device among flat panel display devices is described in the exemplary embodiment of the present invention, the bezel structure and the cover bezel structure may be applied to all kinds of the flat panel display devices such as a liquid crystal display (LCD) device, and a field emission display (FED) device.

Consequently, a flat panel display device according to the present invention may improve durability against external shock and bonding strength when equipped in an electronic appliance.

Further, a bezel and a cover bezel are easily coupled with each other and handled, so that reliability of products can be improved and a production cost can be reduced.

Although the present invention has been described with reference to specific exemplary embodiments thereof, it will be understood by those skilled in the art that a variety of modifications and variations may be made to the present invention without departing from the spirit or scope of the present invention defined in the appended claims, and their equivalents.

What is claimed is:

1. A flat panel display (FPD) device, comprising:
- a flat display panel including a plurality of pixels to display an image; and
- a bezel for accommodating the flat display panel, the bezel comprising:
  - a substrate part having a surface on which the flat display panel is disposed;
  - a protrusion; and
  - a bent part formed between the substrate part and the protrusion to connect the protrusion to the substrate part, the bent part including a hemming structure in which a layer of the bent part extending substantially perpendicular to the surface of the substrate part is folded about an axis substantially parallel to the surface of the substrate.

2. The FPD device according to claim 1, wherein the protrusion protrudes substantially parallel to the substrate part from the end of the one of the bent parts.

3. The FPD device according to claim 1, wherein the flat display panel is attached to the bezel by a cushion tape having an adhesive tape on one and the other surfaces thereof.

4. The FPD device according to claim 3, wherein the cushion tape is formed of a PORON material.

5. The FPD device according to claim 1, wherein the bezel is formed of a conductive metallic material.

6. The FPD device according to claim 1, wherein the substrate part, the bent parts and the protrusion are formed of the same material.

7. The FPD device according to claim 1, wherein the flat display panel further includes a thin film transistor having a semiconductor layer.

8. A flat panel display (FPD) device, comprising:
- a flat display panel including a plurality of pixels to display an image;
- a bezel for accommodating the flat display panel, the bezel comprising:
  - a substrate part having a surface on which the flat display panel is disposed;
  - a protrusion; and
  - a bent part formed between the substrate part and the protrusion to connect the protrusion to the substrate part, the bent part including a hemming structure in which a layer of the bent part extending substantially perpendicular to the surface of the substrate part is folded about an axis substantially parallel to the surface of the substrate; and
- a cover bezel covering the bezel and the flat display panel, the cover bezel having an open window through which light from the flat panel display transmits, the cover bezel including an insertion part that is coupled with the protrusion.

9. The FPD device according to claim 8, wherein the insertion part has an opening to which the protrusion is coupled, the cover bezel further including a bent part that is formed by bending an edge of the cover bezel.

10. The FPD device according to claim 9, wherein the insertion part is formed at the bent part of the cover bezel, and extends beyond the bent part of the cover bezel.

11. The FPD device according to claim 8, wherein the protrusion is formed perpendicular to the bent part of the bezel.

12. The FPD device according to claim 8, wherein the protrusion includes a coupling part fastened to the insertion part and a body part supporting the coupling part.

13. The FPD device according to claim 12, wherein the coupling part is formed thicker than the body part.

14. The FPD device according to claim 8, wherein the insertion part has an opening to which the protrusion is coupled, an outer size of the opening of the insertion part being smaller than an inner size of the opening of the insertion part.

15. The FPD device according to claim 8, wherein the bezel and the cover bezel are formed of a metallic material.

16. The FPD device according to claim 8, wherein the substrate part, the bent part of the bezel and the protrusion are formed of the same material.

17. The FPD device according to claim 8, wherein the flat display panel is attached to the bezel by a cushion tape having an adhesive tape on one and the other surfaces thereof.

18. The FPD device according to claim 8, wherein the flat display panel is attached to the cover bezel by a cushion tape having an adhesive tape at one surface thereof.

19. The FPD device according to claim 18, wherein the cushion tape is formed of a PORON material.

20. The FPD device according to claim 8, wherein the flat display panel further includes a thin film transistor having a semiconductor layer.

* * * * *